United States Patent
Kijima et al.

(10) Patent No.: US 9,887,348 B2
(45) Date of Patent: Feb. 6, 2018

(54) FERROELECTRIC CERAMICS AND MANUFACTURING METHOD THEREOF

(71) Applicant: YOUTEC CO., LTD., Chiba (JP)

(72) Inventors: Takeshi Kijima, Chiba (JP); Yuuji Honda, Chiba (JP); Koichi Furuyama, Chiba (JP)

(73) Assignee: YOUTEC CO., LTD., Chiba (JP)

( * ) Notice: Subject to any disclaimer, the term of this patent is extended or adjusted under 35 U.S.C. 154(b) by 0 days.

(21) Appl. No.: 14/620,496

(22) Filed: Feb. 12, 2015

(65) Prior Publication Data
US 2015/0236244 A1    Aug. 20, 2015

(30) Foreign Application Priority Data
Feb. 18, 2014    (JP) .................. 2014-028924

(51) Int. Cl.
*H01L 41/187*    (2006.01)
*H01L 41/27*    (2013.01)
*C23C 28/00*    (2006.01)
*H01L 41/319*    (2013.01)
*H01L 41/08*    (2006.01)

(52) U.S. Cl.
CPC ........ *H01L 41/319* (2013.01); *H01L 41/0815* (2013.01)

(58) Field of Classification Search
None
See application file for complete search history.

(56) References Cited

U.S. PATENT DOCUMENTS

| | | | | |
|---|---|---|---|---|
| 2002/0015852 A1* | 2/2002 | Noguchi | ............ | C30B 23/02 428/469 |
| 2002/0076875 A1* | 6/2002 | Wasa | ............ | B41J 2/161 438/207 |
| 2012/0038712 A1* | 2/2012 | Akiyama | ............ | H01L 41/318 347/54 |
| 2015/0030846 A1* | 1/2015 | Kijima | ............ | H01L 41/0815 428/337 |
| 2015/0147587 A1* | 5/2015 | Kijima | ............ | H01L 41/1876 428/623 |

FOREIGN PATENT DOCUMENTS

| | | |
|---|---|---|
| JP | 11-312801 | 11/1999 |
| WO | 2006/087777 | 8/2006 |

OTHER PUBLICATIONS

Askeland. Essentials of Materials Science & Engineering, 2009, 66.*
Tokita et al. Jpn. J. Appl. Phys. vol. 39, 2000, 5399-5402.*

* cited by examiner

*Primary Examiner* — Vera Katz
(74) *Attorney, Agent, or Firm* — Wenderoth, Lind & Ponack, L.L.P.

(57) ABSTRACT

To obtain a piezoelectric film having excellent piezoelectric properties. One aspect of the present invention relates to ferroelectric ceramics including a $ZrO_2$ film oriented in (200), a Pt film that is formed on the $ZrO_2$ film and is oriented in (200) and a piezoelectric film formed on the Pt film.

2 Claims, 8 Drawing Sheets

| STRO(100) [EQUIVALENT TO 200] | 111 |
| Pt(200) | 103 |
| PtO$_2$(200) | 104 |
| CeO$_2$(200) | 105 |
| ZrO$_2$(200) | 102 |
| Si(100) | 101 |

FERROELECTRIC CERAMICS AND MANUFACTURING METHOD THEREOF

BACKGROUND OF THE INVENTION

Field of the Invention

The present invention relates to ferroelectric ceramics and a manufacturing method thereof.

Description of a Related Art

A conventional manufacturing method of a $Pb(Zr,Ti)O_3$ (hereinafter, referred to as "PZT") perovskite-type ferroelectric ceramic will be explained.

A $SiO_2$ film having a thickness of 300 nm is, formed on a 4-inch Si wafer, and a $TiO_x$ film having a thickness of 5 nm is formed on the $SiO_2$ film. Next, a Pt film having a thickness of 150 nm, oriented in, for example, (111) is formed on the $TiO_x$ film, and a PZT sol-gel solution is applied onto the Pt film by using a spin coater. Spin conditions at this time are such that the wafer is rotated at a rotational speed of 1500 rpm for 30 seconds and is rotated at a rotational speed of 4000 rpm for 10 seconds.

Next, the applied PZT sol-gel solution is heated and held on a hot plate at 250° C. for 30 seconds to thereby be dried, and moisture is removed, and after that, is additionally heated and held for 60 seconds on a hot plate maintained at a high temperature of 500° C. to thereby perform temporary calcination. A PZT amorphous film having a thickness of 150 nm is produced by repeating this for several times.

Subsequently, an annealing treatment is performed on the PZT amorphous film at 700° C. by using a pressurizing-type lamp annealing device (RTA: rapidly thermal anneal) to thereby carry out PZT crystallization. The PZT film thus crystallized is formed of a perovskite structure (refer to, for example, Patent Literature 1).

[Patent Literature 1] WO 2006/087777

[Patent Literature 2] Japanese Patent Laid-Open No. 11-312801

SUMMARY OF THE INVENTION

An aspect of the present invention is to solve the problem of obtaining a piezoelectric film having excellent piezoelectric properties.

Hereinafter, various aspects of the present invention will be explained.

[1] Ferroelectric ceramics including:
a $ZrO_2$ film oriented in (200);
a Pt film that is formed on the $ZrO_2$ film and is oriented in (200); and
a piezoelectric film formed on the Pt film.

[2] The ferroelectric ceramics according to [1], wherein a $PtO_2$ film oriented in (200) is formed between the $ZrO_2$ film and the Pt film.

[3] The ferroelectric ceramics according to [1] or [2], wherein:
said $ZrO_2$ film is formed on a Si substrate; and
said Si substrate is oriented in (100).

[4] Ferroelectric ceramics including:
a Pt film formed on a $CeO_2$ film; and
a piezoelectric film formed on the Pt film.

[5] The ferroelectric ceramics according to [4], wherein:
a $Ce_7O_{12}$ film is formed under said $CeO_2$ film; and
a $PtO_2$ film is formed between said $CeO_2$ film and said Pt film.

[6] The ferroelectric ceramics according to [4] or [5], wherein:
said $CeO_2$ film is formed on a Si substrate;
said Si substrate is oriented in (100);
said $CeO_2$ film is oriented in (200); and
said Pt film is oriented in (200).

[7] The ferroelectric ceramics according to [5], wherein:
said $Ce_7O_{12}$ film is formed on a Si substrate;
said Si substrate is oriented in (100);
said $Ce_7O_{12}$ film is oriented in (300);
said $CeO_2$ film is oriented in (200);
said $PtO_2$ film is oriented in (200); and
said Pt film is oriented in (200).

[8] The ferroelectric ceramics according to [4], wherein a $HfO_2$ film is formed under said $CeO_2$ film or between said $CeO_2$ film and said Pt film.

[9] The ferroelectric ceramics according to [5], wherein a $HfO_2$ film is formed between said $CeO_2$ film and said $PtO_2$ film.

[10] The ferroelectric ceramics according to [8] wherein:
said $CeO_2$ film is formed on a Si substrate;
said Si substrate is oriented in (100);
said $CeO_2$ film is oriented in (200);
said $HfO_2$ film is oriented in (200); and
said Pt film is oriented in (200)

[11] The ferroelectric ceramics according to [9], wherein:
said $Ce_7O_{12}$ film is formed on a Si substrate;
said Si substrate is oriented in (100);
said $Ce_7O_{12}$ film is oriented in (300);
said $CeO_2$ film is oriented in (200);
said $HfO_2$ film is oriented in (200);
said $PtO_2$ film is oriented in (200); and
said Pt film is oriented in (200)

[12] Ferroelectric ceramics including:
a Pt film formed on a $HfO_2$ film; and
a piezoelectric film formed on the Pt film.

[13] The ferroelectric ceramics according to [12], wherein a $PtO_2$ film is formed between said $HfO_2$ film and said Pt film.

[14] The ferroelectric ceramics according to [12] or [13], wherein:
said $HfO_2$ film is formed on a Si substrate;
said Si substrate is oriented in (100);
said $HfO_2$ film is oriented in (200); and
said Pt film is oriented in (200).

[15] The ferroelectric ceramics according to [13], wherein:
said $HfO_2$ film is formed on a Si substrate;
said Si substrate is oriented in (100);
said $HfO_2$ film is oriented in (200);
said $PtO_2$ film is oriented in (200); and
said Pt film is oriented in (200).

[16] A manufacturing method of ferroelectric ceramics, including the steps of:
forming a $ZrO_2$ film on a Si substrate at a temperature of 550° C. or less, by an evaporation method;
forming a Pt film on the $ZrO_2$ film at a temperature of 550° C. or less, by sputtering; and
forming a piezoelectric film on the Pt film, wherein:
the $ZrO_2$ film is oriented in (200); and
the Pt film is oriented in (200).

[17] The manufacturing method of ferroelectric ceramics according to [16], wherein a $PtO_2$ film oriented in (200) is formed between the $ZrO_2$ film and the Pt film.

Note that, in the above-described various aspects of the present invention, the phrase of forming a specified B (hereinafter, referred to as "B") on (or under) a specified A (hereinafter, referred to as "A") (or "B" is formed on (or under) "A") is not limited to the case of forming "B" (the case where "B" is formed) directly on (or under) "A," but the phrase also includes the case of forming "B" (the case where "B" is formed) on (or under) "A" via another substance within the scope not hindering the working effect of the present invention."

A piezoelectric film having excellent piezoelectric properties can be obtained by the application of one aspect of the present invention.

DESCRIPTION OF THE PREFERRED EMBODIMENTS

Hereinafter, embodiments and Examples of the present invention will be explained in detail using the drawings. However, a person skilled in the art would be able to easily understand that the present invention is not limited to the following explanations but forms and details thereof may be variously modified without deviating from the purport and the scope of the present invention. Accordingly, the present invention is not to be construed as being limited to the description of the embodiments and Examples, shown below.

(First Embodiment)

In Patent Literature 2 (Japanese Patent Laid-Open No. 11-312801), paragraph 0004, there is such description as below. When forming a Pt thin film directly on a $ZrO_2$ (001) thin film, the Pt becomes (111) -oriented or polycrystal and a Pt (100) single oriented film cannot be formed. This is because, since lattice mismatch between a $ZrO_2$ (001) plane and a Pt (100) plane is large, the Pt grows with a (111) plane more stable energetically as a growth plane, rather than the fact that the Pt epitaxially grows, that is, the Pt grows with (100) plane as a growth plane.

The present inventors repeated hard developments, and succeeded in orienting the Pt film in (100) even when forming a Pt film directly on a $ZrO_2$ film not having mixed with $Y_2O_3$. The Young's modulus of a $ZrO_2$ film is 210 GPa but, in contrast, the Young's modulus of a YSZ film obtained by mixing $Y_2O_3$ in $ZrO_2$ is from 400 to 440 GPa. Therefore, when a YSZ film is formed on a substrate at a temperature of from 700° C. to 1000° C. (in Example 1 of Patent Literature 2, described as a temperature of 900° C.) by an evaporation method and a piezoelectric film is formed on the YSZ film, the resultant product becomes too hard as a substrate, whereas, when a $ZrO_2$ film is formed on a substrate at a temperature of 500° C. and a piezoelectric film is formed on the $ZrO_2$ film, the resultant product is not too hard as a substrate and is easily used. The YSZ film means a film that includes a mixture of $Y_2O_3$ and $ZrO_2$ obtained by oxidation of Y and Zr with oxygen and that is in a stable state.

Note that, in the specification, being oriented in (100) and being oriented in (200) are substantially equal to each other.

Figure 1:
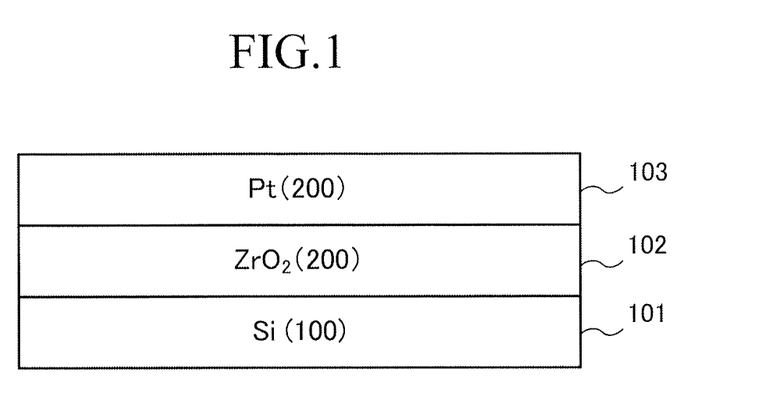
FIG. 1 is a schematic cross-sectional view explaining a manufacturing method of ferroelectric ceramics according to one aspect of the present invention.

FIG. 1 is a schematic cross-sectional view explaining a manufacturing method of ferroelectric ceramics according to one aspect of the present invention.

A substrate 101 is prepared. Various kinds of substrates can be used as the substrate, and there can be used, for example, substrates of a single crystal such as a Si single crystal or a sapphire single crystal, substrates of a single crystal with a metal oxide film formed on the surface thereof, substrates with a polysilicon film or a silicide film formed on the surface thereof, and the like. Note that, in the present embodiment, a Si substrate oriented in (100) is used.

Next, a $ZrO_2$ film (not shown) is formed on the Si substrate 101 at a temperature of 550° C. or less (preferably at 500° C.) by an evaporation method. The $ZrO_2$ film 102 is oriented in (200). Note that, when a $ZrO_2$ film is formed at a temperature of 750° C. or more by an evaporation method, the $ZrO_2$ film is not oriented in (200).

Figure 2:
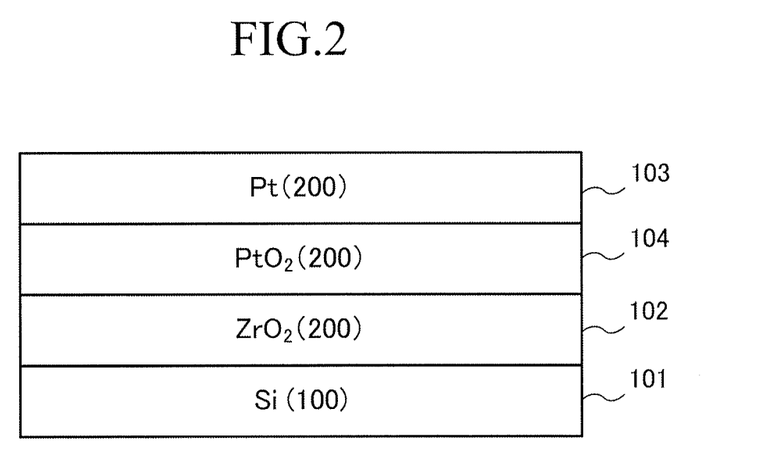
FIG. 2 is a schematic cross-sectional view explaining a manufacturing method of ferroelectric ceramics according to one aspect of the present invention.

After that, a Pt film 103 by epitaxial growth is formed on the $ZrO_2$ film 102 at a temperature of 550° C. or less (preferably at 400° C.), by sputtering. The Pt film 103 is oriented in (200) (refer to FIG. 1). At this time, as shown in FIG. 2, a $PtO_2$ film 104 oriented in (200) may be formed between the $ZrO_2$ film 102 and the Pt film 103. Note that the Pt film 103 can be functioned as an electrode film.

By setting the substrate temperature to be 550° C. or less when forming the $ZrO_2$ film 102 and the Pt film 103 and controlling the growth rate and thermal stress of the film to be low, as described above, it is possible to orient the Pt film in (200) even when forming the Pt film 103 directly on a $ZrO_2$ film 102 without the mixing of $Y_2O_3$.

Next, a PZT film (not shown) being an example of a piezoelectric film is formed on the Pt film 103. Note that, in the present specification, a "PZT film" also includes a film of a pure composition containing an impurity therein, and it is assumed that various impurities can be incorporated as long as the function of the piezoelectric body of a PZT film is not extinguished even when the impurity is incorporated.

Hereinafter, an example of a formation method of a PZT film will be specifically explained.

As a sol-gel solution for forming the PZT film, there was used an E1 solution having a concentration of 10% by weight, which contains butanol as a solvent and which is obtained by adding lead in an insufficient amount by 70% to 90%.

An alkaline alcohol having an amino group, referred to as dimethylamino ethanol, was added to the sol-gel solution at a ratio of E1 sol-gel solution: dimethylamino ethanol=7:3 in a volume ratio, which exhibited strong alkalinity of pH=12.

A PZT amorphous film was formed using the above-described solution by spin coating. MS-A200 manufactured by MIKASA CO., LTD. was used as a spin coater. First, the coater was rotated at 800 rpm for 5 seconds and at 1500 rpm for 10 seconds, then the rotational speed was raised gradually to 3000 rpm in 10 seconds, which was left on a hot plate (AHS-300, a ceramic hot plate manufactured by AS ONE Corporation) at 150° C. for 5 minutes in the air, after that, was left on a hot plate (AHS-300) at 300° C. for 10 minutes also in the air, and subsequently, was cooled to room temperature. The process was repeated five times to thereby form a PZT amorphous film having an intended thickness of 200 nm on the Pt film 103. The product was formed in plural number.

Next, a heat treatment was performed on the above-described PZT amorphous film in a pressurized oxygen atmosphere to thereby form a PZT film obtained by crystallizing the PZT amorphous film, on the Pt film 103. Note that an example of the lattice constant of PZT is 0.401 nm.

After forming a PZT film as described above, the PZT film may be subjected to a polling processing.

According to the present embodiment, since the Pt film 103 is oriented in (100) or (200), a piezoelectric film having excellent piezoelectric properties can be obtained by forming a PZT film as a piezoelectric film on the Pt film 103.

Furthermore, the use of the $ZrO_2$ film 102 having a low Young's modulus as low as a half of that of $Y_2O_3$ is advantageous in that the movement of the piezoelectric film is not prevented. Moreover, no mixing of another element such as Y other than Zr is also advantageous in that contamination is suppressed. In addition, very low unit price by gram of Zr is also advantageous in that the cost is suppressed.

EXAMPLE 1

Figure 3:
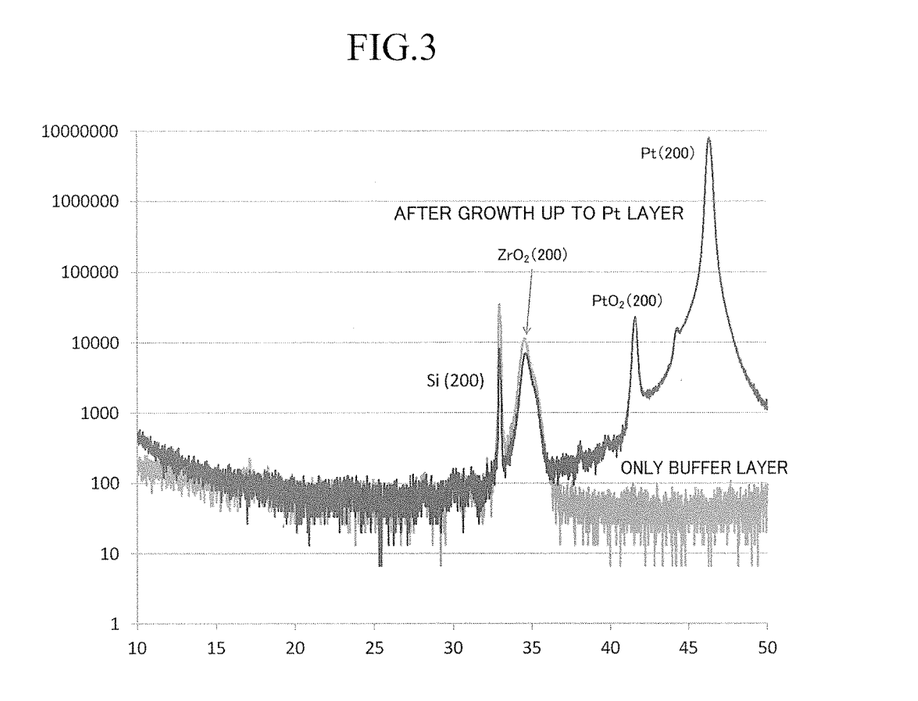
FIG. 3 is an XRD (X-Ray Diffraction) chart of a sample in Example 1 being an example of a first embodiment.

FIG. 3 is an XRD (X-Ray Diffraction) chart of a sample in Example 1 of the present embodiment. In FIG. 3, the vertical axis shows intensity and the horizontal axis shows $2\theta$. The sample was produced as follows.

A $ZrO_2$ film was formed on a Si wafer having a (100) crystal plane by a reactive evaporation method. Evaporation conditions at this time are as shown in Table 1. The $ZrO_2$ film was oriented in (200).

Subsequently, a Pt film was formed on the $ZrO_2$ film, by sputtering. Conditions of film formation at this time are as shown in Table 1. The Pt film was oriented in (200).

TABLE 1

| Process | EXAMPLE | |
|---|---|---|
| | EVAPORATION | DC-SPUTTERING |
| Depo Vac | 6.90E−03 | 3.20E−02 |
| Depo Source | Zr + $O_2$ | Pt |
| ACC/Emission | 7.5 kV/1.50 mA | DC/100 W |
| Total Thickness (nm) | 13.4 | 150 |
| Depo Time (sec) | 930 | 720 |
| SV deg (Tsub) | 500° C. | 400° C. |
| MFC $O_2$ | 5 sccm | Ar: 16 sccm |

TABLE 1-continued

The XRD chart shown in FIG. 3 shows a result of XRD of a sample obtained by forming only the $ZrO_2$ film (only a buffer layer), and a result of XRD of a sample obtained by carried out the formation up to the Pt film (after the growth up to the Pt layer). From the XRD chart, it was confirmed that the Si wafer was oriented in (200), that the $ZrO_2$ film was oriented in (200), and that the Pt film was oriented in (200), and it was confirmed that a $PtO_2$ film oriented in (200) was formed.

According to the Example, it becomes possible to form, on the Pt film, a PZT film having very good crystallinity and excellent piezoelectric properties by orienting the Pt film in (200).

(Second Embodiment)

Figure 4:
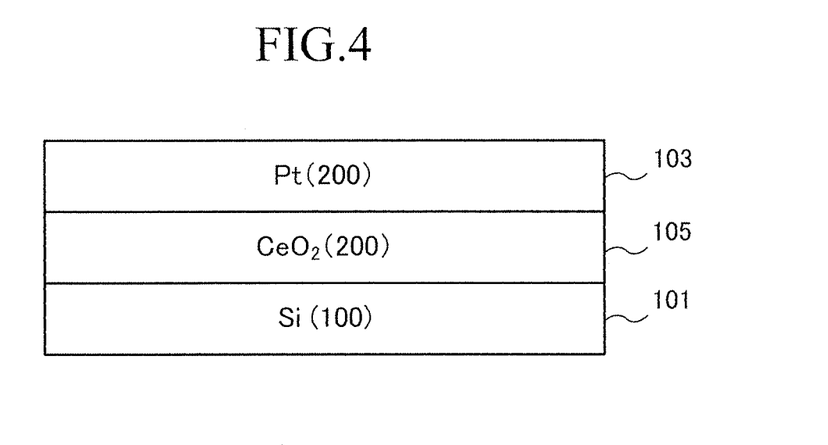
FIG. 4 is a schematic cross-sectional view explaining a manufacturing method of ferroelectric ceramics according to one aspect of the present invention.

FIG. 4 is a schematic cross-sectional view explaining a manufacturing method of ferroelectric ceramics according to one aspect of the present invention, in which the same sign is attached to the same portion as that in FIG. 1 and the explanation thereof is omitted.

Figure 5:
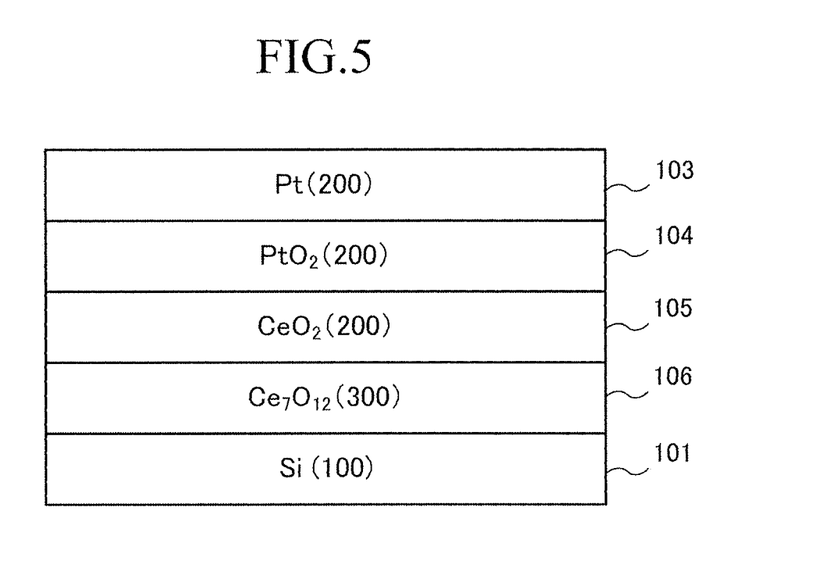
FIG. 5 is a schematic cross-sectional view explaining a manufacturing method of ferroelectric ceramics according to one aspect of the present invention.

A $CeO_2$ film 105 is formed on the Si substrate 101 by an evaporation method. The $CeO_2$ film 105 is oriented in (200) (refer to FIG. 4). At this time, as shown in FIG. 5, a $Ce_7O_{12}$ film 106 oriented in (300) may be formed between the Si substrate 101 and the $CeO_2$ film 105. Note that, in the present embodiment, the $CeO_2$ film 105 is formed on the Si substrate 101, but the embodiment is not limited to this, and a $ZrO_2$ film may be formed between the Si substrate 101 and the $CeO_2$ film 105 by an evaporation method. Furthermore, in the present embodiment, the $CeO_2$ film 105 is formed by an evaporation method, but the $CeO_2$ film 105 may be formed by an ion beam sputtering or radio-frequency (RF) sputtering.

After that, the Pt film 103 by epitaxial growth is formed on the $CeO_2$ film 105, by sputtering. The Pt film 103 is oriented in (200) (refer to FIG. 4). At this time, as shown in FIG. 5, the $PtO_2$ film 104 oriented in (200) maybe formed between the $CeO_2$ film 105 and the Pt film 103.

The Pt film 103 can be oriented in (200) by forming the Pt film 103 on the $CeO_2$ film 105 as described above.

Next, a PZT film (not shown) being an example of a piezoelectric film is formed on the Pt film 103.

According to the present embodiment, since the Pt film 103 is oriented in (100) or (200), a piezoelectric film having excellent piezoelectric properties can be obtained by forming a PZT film as a piezoelectric film on the Pt film 103.

EXAMPLE 2

Figure 6:
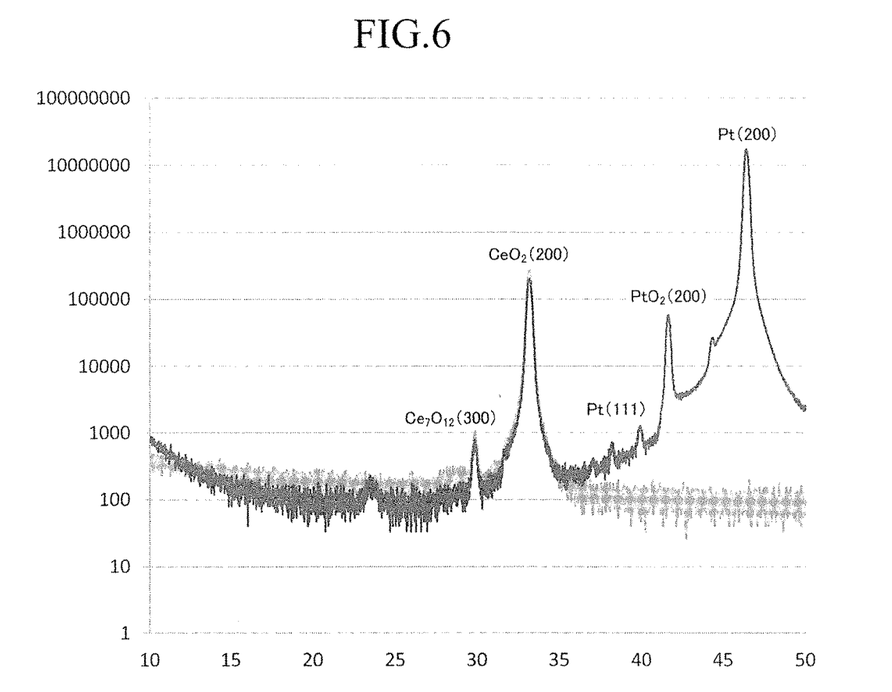
FIG. 6 is an XRD chart of a sample in Example 2 being an example of a second embodiment.

FIG. 6 is an XRD chart of a sample in Example 2 of the present embodiment. In FIG. 6, the vertical axis shows intensity and the horizontal axis shows $2\theta$. The sample was produced as follows.

A $CeO_2$ film was formed on a Si wafer having a (100) crystal plane by a reactive evaporation method. Evaporation conditions at this time are as shown in Table 2. The $CeO_2$ film was oriented in (200).

Subsequently, a Pt film was formed on the $CeO_2$ film, by sputtering. Conditions of film formation at this time are as shown in Table 2. The Pt film was oriented in (200).

TABLE 2

| | EXAMPLE | |
| --- | --- | --- |
| Process | EVAPORATION | DC-SPUTTERING |
| Depo Vac | 6.90E−03 | 3.20E−02 |
| Depo Source | Ce + $O_2$ | Pt |
| ACC/Emission | 7.5 kV/1.50 mA | DC/100 W |
| Total Thickness (nm) | 13.4 | 150 |
| Depo Time (sec) | 930 | 720 |
| SV deg (Tsub) | 500° C. | 400° C. |
| MFC $O_2$ | 5 sccm | Ar: 16 sccm |

The XRD chart shown in FIG. 6 shows a result of XRD of a sample obtained by forming only the $CeO_2$ film, and a result of XRD of a sample obtained by carried out the formation up to the Pt film. From the XRD chart, it was confirmed that the $CeO_2$ film was oriented in (200), and that the Pt film was oriented in (200), and it was confirmed that a $Ce_7O_{12}$ film oriented in (300) was formed and a $PtO_2$ film oriented in (200) was formed.

According to the Example, it becomes possible to form, on the Pt film, a PZT film having excellent piezoelectric properties, by orienting the Pt film in (200).

(Third Embodiment)

Figure 7:
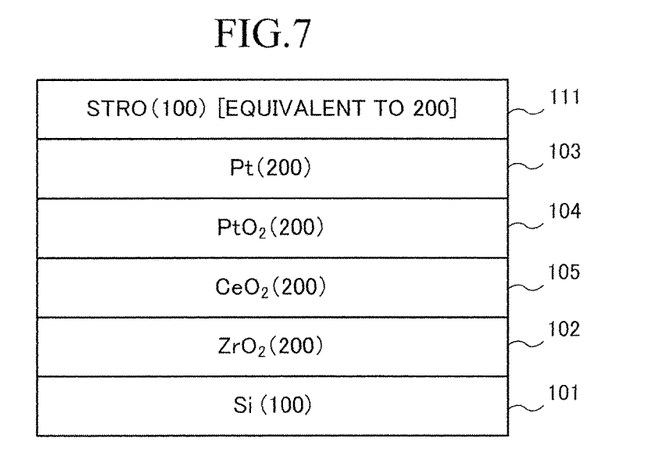
FIG. 7 is a schematic cross-sectional view explaining a manufacturing method of ferroelectric ceramics according to one aspect of the present invention.

FIG. 7 is a schematic cross-sectional view explaining a manufacturing method of ferroelectric ceramics according to one aspect of the present invention, in which the same sign is attached to the same portion as that in each of FIGS. 1, 4 and 5 and the explanation thereof is omitted.

The $ZrO_2$ film 102 is formed on the Si substrate 101 by an evaporation method in the same way as that in the first embodiment. The $ZrO_2$ film 102 is oriented in (200).

Next, the $CeO_2$ film 105 is formed on the $ZrO_2$ film 102 by an evaporation method in the same way as that in the second embodiment. The $CeO_2$ film 105 is oriented in (200).

Subsequently, the Pt film 103 is formed on the $CeO_2$ film 105 in the same way as that in the second embodiment. The Pt film 103 is oriented in (200). At this time, the $PtO_2$ film 104 oriented in (200) is formed between the $CeO_2$ film 105 and the Pt film 103.

Next, a $Sr(Ti_{1-x}Ru_x)O_3$ film (STRO) is formed on the Pt film 103, by sputtering. Note that the x satisfies a formula 1 below. Furthermore, a sintered body of a $Sr(Ti_{1-x}Ru_x)O_3$ is used as a sputtering target at this time. However, the x satisfies the formula 1 below.

$$0.01 \leq x \leq 0.4 \text{(preferably } 0.05 \leq x \leq 0.2) \quad \text{formula 1}$$

Note that the reason why the x in the $Sr(Ti_{1-x}Ru_x)O_3$ film 111 is 0.4 or less is because, when the x is set to exceed 0.4, the first $Sr(Ti_{1-x}Ru_x)O_3$ film becomes powdery and cannot sufficiently be solidified.

After that, the $Sr(Ti_{1-x}Ru_x)O_3$ film 111 is crystallized by RTA (Rapid Thermal Anneal) in a pressurized oxygen atmosphere.

The $Sr(Ti_{1-x}Ru_x)O_3$ film 111 is a film of a complex oxide of strontium, titanium and ruthenium, the complex oxide being a compound having a perovskite structure.

Next, a PZT film (not shown) being an example of a piezoelectric film is formed on the $Sr(Ti_{1-x}Ru_x)O_3$ film 111.

According to the present embodiment, since the $Sr(Ti_{1-x}Ru_x)O_3$ film 111 is oriented in (100) or (200), a piezoelectric film having excellent piezoelectric properties can be obtained by forming a PZT film as a piezoelectric film on the $Sr(Ti_{1-x}Ru_x)O_3$ film 111.

EXAMPLE 3

Figure 8:
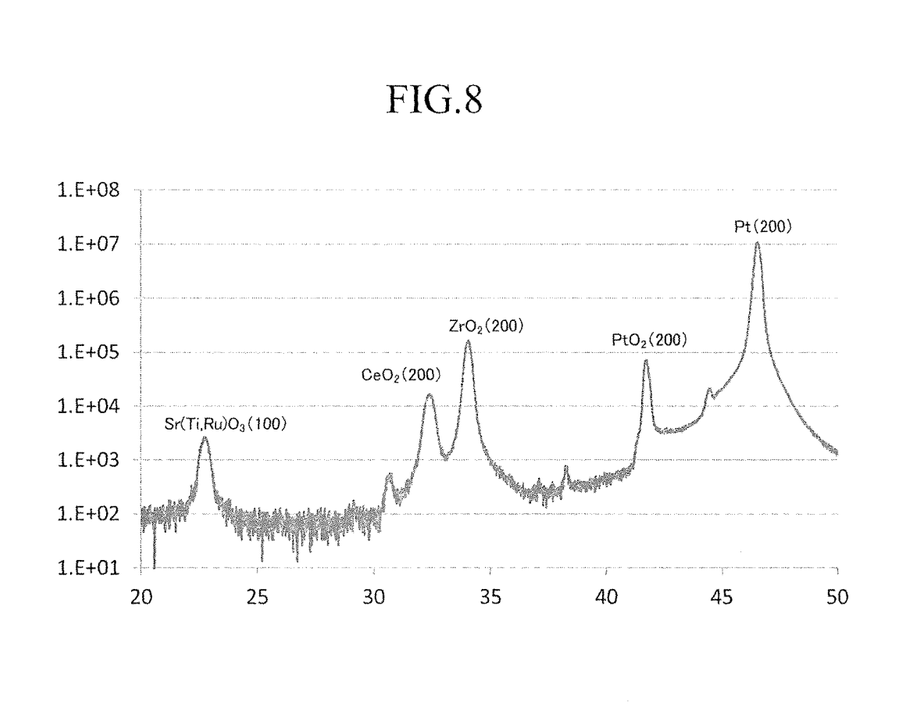
FIG. 8 is an XRD chart of a sample in Example 3.

FIG. 8 is a chart showing a result of XRD (X-Ray Diffraction) of a sample in Example 3. In FIG. 8, the vertical axis shows intensity and the horizontal axis shows 2θ. The sample was produced as follows.

A $ZrO_2$ film was formed on a Si wafer having a (100) crystal plane by a reactive evaporation method. Evaporation conditions at this time are as shown in Table 1. The $ZrO_2$ film was oriented in (200).

Then, a $CeO_2$ film was formed on the $ZrO_2$ film, by a reactive evaporation method. Evaporation conditions at this time are as shown in Table 2. The $CeO_2$ film was oriented in (200).

Subsequently, a Pt film was formed on the $CeO_2$ film, by sputtering. Conditions of film formation at this time are as shown in Table 2. The Pt film was oriented in (200).

Next, a $Sr(Ti_{0.8}Ru_{0.2})O_3$ film was formed on the Pt film, by sputtering. Furthermore, a first $Sr(Ti_{0.95}Ru_{0.05})O_3$ film was formed on the Pt film of a sample 2, by sputtering. Conditions of sputtering at this time are as follows.

[STRO Sputtering Conditions]
Process: RF sputtering
Target: $Sr(Ti_{0.8}Ru_{0.2})O_3$
RF power: 400 W/13.56 MHz
Process pressure: 4 Pa
Gas flow rate Ar/$O_2$ (sccm): 30/10
Substrate temperature: 600° C.
Process time: 20 sec
Film thickness: 50 nm After that, the $Sr(Ti_{0.8}Ru_{0.2})O_3$ film was crystallized by RTA in a pressurized oxygen atmosphere. Conditions of the RTA at this time are as follows.

[RTA Conditions]
Annealing temperature: 600° C.
Introduced gas: oxygen gas
Pressure: 9 kg/$cm^2$
Temperature rising rate: 100 ° C/sec
Annealing time: 5 minutes From the XRD chart shown in FIG. 8, it was confirmed that the $Sr(Ti_{0.8}Ru_{0.2})O_3$ film was oriented in (100), that the $CeO_2$ film was oriented in (200), that the $ZrO_2$ film was oriented in (200) and the Pt film is oriented in (200), and, furthermore, it was confirmed that a $PtO_2$ film oriented in (200) was formed.

According to the Example, it becomes possible to form a PZT film having excellent piezoelectric properties on the $Sr(Ti_{0.8}Ru_{0.2})O_3$ film, by orienting a $Sr(Ti_{0.8}Ru_{0.2})O_3$ film in (100).

(Fourth Embodiment)

Figure 9:
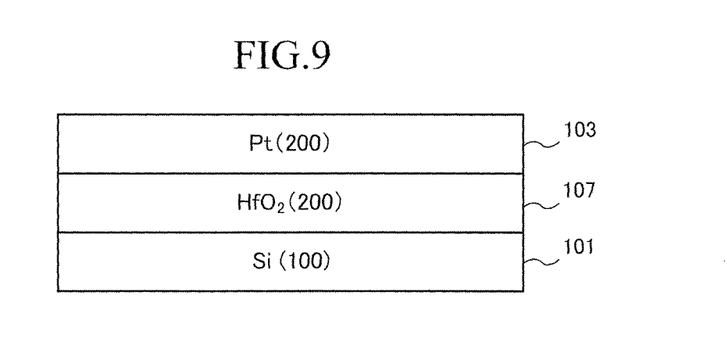
FIG. 9 is a schematic cross-sectional view explaining a manufacturing method of ferroelectric ceramics according to one aspect of the present invention.

FIG. 9 is a schematic cross-sectional view explaining a manufacturing method of ferroelectric ceramics according to one aspect of the present invention, in which the same sign is attached to the same portion as that in FIG. 1, and the explanation thereof is omitted.

A $HfO_2$ film 107 is formed on the Si substrate 101, by an evaporation method. The $HfO_2$ film 107 is oriented in (200) Note that, in the present embodiment, the $HfO_2$ film 107 is formed on the Si substrate 101, but the embodiment is not limited to this, and a $ZrO_2$ film may be formed between the Si substrate 101 and the $HfO_2$ film 107, by an evaporation method. Furthermore, in the present embodiment, the $HfO_2$ film 107 is formed by an evaporation method, but the $HfO_2$ film 107 maybe formed by an ion beam sputtering or radio-frequency (RF) sputtering.

Figure 10:
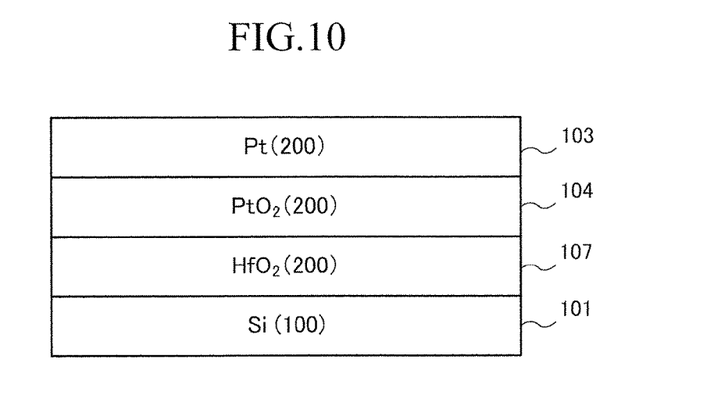
FIG. 10 is a schematic cross-sectional view explaining a manufacturing method of ferroelectric ceramics according to one aspect of the present invention.

After that, the Pt film 103 by epitaxial growth is formed on the $HfO_2$ film 107, by sputtering. The Pt film 103 is oriented in (200) (refer to FIG. 9). At this time, as shown in FIG. 10, the $PtO_2$ film 104 oriented in (200) maybe formed between the $HfO_2$ film 107 and the Pt film 103.

The Pt film 103 can be oriented in (200) by forming the Pt film 103 on the HfO$_2$ film 107 as described above.

Next, a PZT film (not shown) being an example of a piezoelectric film is formed on the Pt film 103.

According to the present embodiment, since the Pt film 103 is oriented in (100) or (200), a piezoelectric film having excellent piezoelectric properties can be obtained by forming a PZT film as a piezoelectric film on the Pt film 103.

EXAMPLE 4

Figure 11:
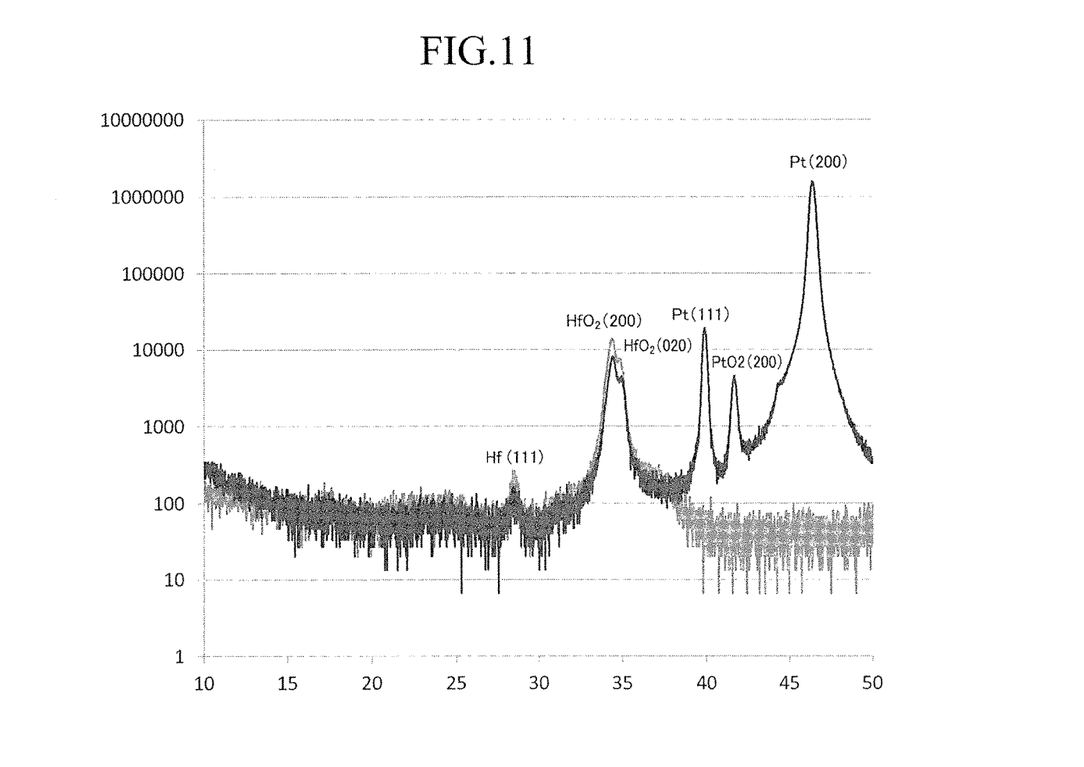
FIG. 11 is an XRD chart of a sample in Example 4 being an example of a fourth embodiment.

FIG. 11 is an XRD chart of a sample in Example 4 of the present embodiment. In FIG. 11, the vertical axis shows intensity and the horizontal axis shows 2θ. The sample was produced as follows.

A HfO$_2$ film was formed on a Si wafer having a (100) crystal plane by a reactive evaporation method. Evaporation conditions at this time are as shown in Table 3. The HfO$_2$ film was oriented in (200).

Subsequently, a Pt film was formed on the HfO$_2$ film, by sputtering. Conditions of film formation at this time are as shown in Table 3. The Pt film was oriented in (200)

TABLE 3

| | EXAMPLE | |
|---|---|---|
| Process | EVAPORATION | DC-SPUTTERING |
| Depo Vac | 6.90E−03 | 3.20E−02 |
| Depo Source | Hf + O$_2$ | Pt |
| ACC/Emission | 7.5 kV/1.50 mA | DC/100 W |
| Total Thickness (nm) | 13.4 | 150 |
| Depo Time (sec) | 930 | 720 |
| SV deg (Tsub) | 500° C. | 400° C. |
| MFC O$_2$ | 5 sccm | Ar: 16 sccm |

The XRD chart shown in FIG. 11 shows a result of XRD of a sample obtained by forming only a HfO$_2$film, and a result of XRD of a sample obtained by carried out the formation up to the Pt film. From the XRD chart, it was confirmed that the Si wafer was oriented in (200), that the HfO$_2$ film was oriented in (200), and that the Pt film was oriented in (200), and it was confirmed that a PtO$_2$ film oriented in (200) was formed.

According to the Example, it becomes possible to form, on the Pt film, a PZT film having excellent piezoelectric properties, by orienting the Pt film in (200).

(Fifth Embodiment)

Figure 12:
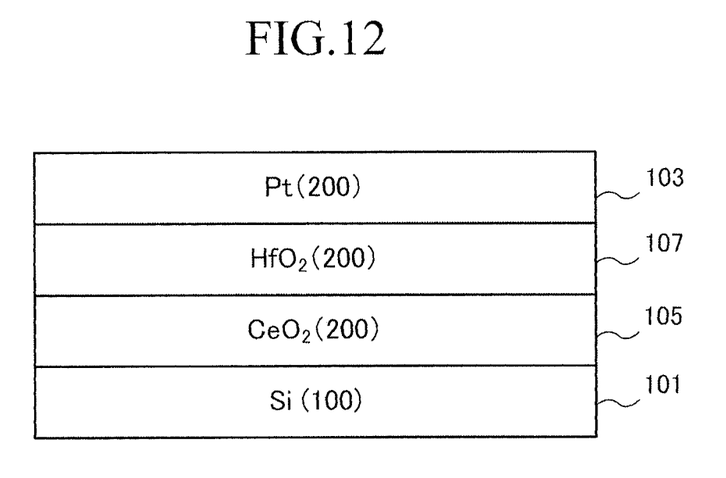
FIG. 12 is a schematic cross-sectional view explaining a manufacturing method of ferroelectric ceramics according to one aspect of the present invention.

FIG. 12 is a schematic cross-sectional view explaining a manufacturing method of ferroelectric ceramics according to one aspect of the present invention, in which the same sign is attached to the same portion as that in FIG. 1 and the explanation thereof is omitted.

Figure 13:
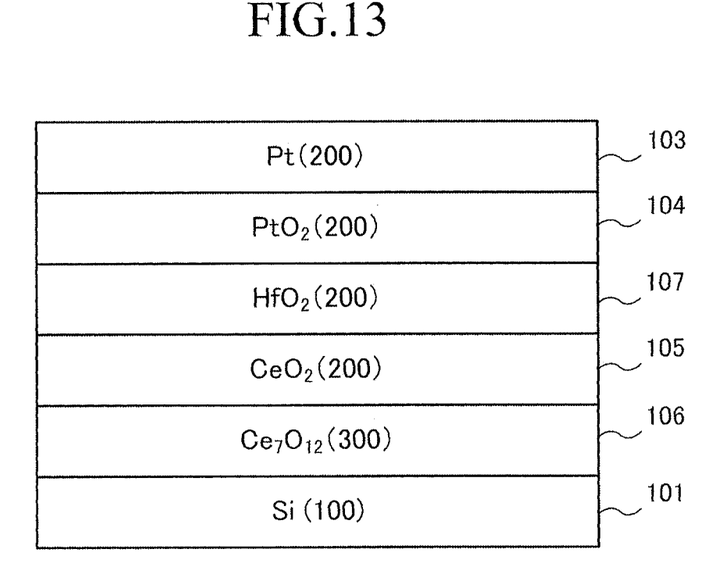
FIG. 13 is a schematic cross-sectional view explaining a manufacturing method of ferroelectric ceramics according to one aspect of the present invention.

A CeO$_2$ film 105 is formed on the Si substrate 101, by an evaporation method. The CeO$_2$ film 105 is oriented in (200) (refer to FIG. 12). At this time, as shown in FIG. 13, a Ce$_7$O$_{12}$ film 106 oriented in (300) may be formed between the Si substrate 101 and the CeO$_2$ film 105. Note that, in the present embodiment, the CeO$_2$ film 105 is formed on the Si substrate 101, but the embodiment is not limited to this, and a ZrO$_2$ film may be formed between the Si substrate 101 and the CeO$_2$ film 105, by an evaporation method.

Next, a HfO$_2$ film 107 is formed on the CeO$_2$ film 105, by an evaporation method. The HfO$_2$ film 107 is oriented in (200). Note that, in the present embodiment, the CeO$_2$ film 105 and the HfO$_2$ film 107 are formed by an evaporation method, but the CeO$_2$ film 105 and the HfO$_2$ film 107 may be formed by an ion beam sputtering or radio-frequency (RF) sputtering.

After that, the Pt film 103 by epitaxial growth is formed on the HfO$_2$ film 107, by sputtering. The Pt film 103 is oriented in (200) (refer to FIG. 12). At this time, as shown in FIG. 13, the PtO$_2$ film 104 oriented in (200) may be formed between the HfO$_2$ film 107 and the Pt film 103.

The Pt film 103 can be oriented in (200) by forming the Pt film 103 on the HfO$_2$ film 107 as described above.

Next, a PZT film (not shown) being an example of a piezoelectric film is formed on the Pt film 103.

According to the present embodiment, since the Pt film 103 is oriented in (100) or (200), a piezoelectric film having excellent piezoelectric properties can be obtained by forming a PZT film as a piezoelectric film on the Pt film 103.

Note that, in the present embodiment, the CeO$_2$ film 105, the HfO$_2$ film 107 and the Pt film 103 are formed on the Si substrate 101, in this order, but the embodiment is not limited to this, and the HfO$_2$ film 107, the CeO$_2$ film 105 and the Pt film 103 may be formed on the Si substrate 101, in this order.

EXAMPLE 5

Figure 14:
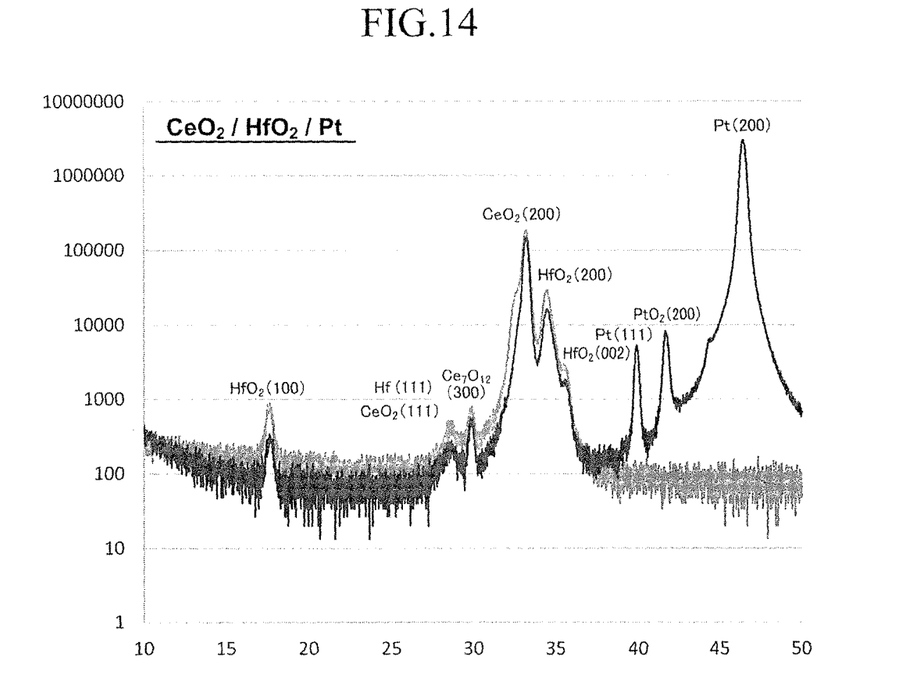
FIG. 14 is an XRD chart of a sample in Example 5 being an example of a fifth embodiment.

FIG. 14 is an XRD chart of a sample in Example 5 of the present embodiment. In FIG. 14, the vertical axis shows intensity and the horizontal axis shows 2θ. The sample was produced as follows.

A CeO$_2$ film was formed on a Si wafer having a (100) crystal plane, by a reactive evaporation method. Evaporation conditions at this time are the same as those in Example 2. The CeO$_2$ film was oriented in (200).

Subsequently, a HfO$_2$ film was formed on the CeO$_2$ film, by a reactive evaporation method. Evaporation conditions at this time are the same as those in Example 4. The HfO$_2$ film was oriented in (200).

Then, a Pt film was formed on the HfO$_2$ film, by sputtering. Conditions of film formation at this time are the same as those in Example 4. The Pt film was oriented in (200).

The XRD chart shown in FIG. 14 shows a result of XRD f a sample obtained by carried out the formation up to the HfO$_2$ film, and a result of XRD of a sample obtained by carried out the formation up to the Pt film. From the XRD chart, it was confirmed that the CeO$_2$ film was oriented in (200), that the HfO$_2$ film was oriented in (200), and that the Pt film was oriented in (200), and it was confirmed that a Ce$_7$O$_{12}$ film oriented in (300) was formed and a PtO$_2$ film oriented in (200) was formed.

According to the Example, it becomes possible to form a PZT film having excellent piezoelectric properties on a Pt film by orienting the Pt film in (200).

Note that above-described first to fifth embodiments may appropriately be combined and carried out.

DESCRIPTION OF REFERENCE SYMBOLS

101 Si substrate
102 ZrO$_2$ film
103 Pt film
104 PtO$_2$ film
105 CeO$_2$ film
106 Ce$_7$O$_{12}$ film
107 HfO$_2$ film
111 Sr(Ti$_{1-x}$Ru$_x$)O$_3$ film (STRO)

The invention claimed is:
1. Ferroelectric ceramics comprising:
   a $ZrO_2$ film oriented in (200);
   a $PtO_2$ film that is formed directly on said $ZrO_2$ film and is oriented in (200);
   a Pt film that is formed on said $PtO_2$ film and is oriented in (200); and
   a piezoelectric film formed on said Pt film.
2. The ferroelectric ceramics according to claim 1, wherein a $Sr(Ti_{1-x}Ru_x)O_3$ film oriented in (200) is formed between said Pt film and said piezoelectric film, and x satisfies formula 1:

$0.01 \leq x \leq 0.4$   formula 1.

* * * * *